(12) United States Patent
Shah

(10) Patent No.: US 7,548,136 B1
(45) Date of Patent: Jun. 16, 2009

(54) DISTORTION REDUCTION FOR VARIABLE CAPACITANCE DEVICES

(75) Inventor: Peter Jivan Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 30 days.

(21) Appl. No.: 11/758,562

(22) Filed: Jun. 5, 2007

Related U.S. Application Data

(60) Provisional application No. 60/812,574, filed on Jun. 9, 2006.

(51) Int. Cl.
*H03H 7/00* (2006.01)
*H03H 11/00* (2006.01)

(52) U.S. Cl. ............... 333/174; 333/176; 333/214

(58) Field of Classification Search ............ 333/174, 333/213–217; 334/15
See application file for complete search history.

(56) References Cited

U.S. PATENT DOCUMENTS 3,290,618 A * 12/1966 Leysieffer ............... 332/136
3,684,977 A * 8/1972 Viles ..................... 331/183
4,195,274 A * 3/1980 Suganuma ................ 334/15
6,707,354 B2 * 3/2004 Pollet et al. .............. 333/214
2005/0083151 A1 * 4/2005 Xiao et al. ............... 333/215

FOREIGN PATENT DOCUMENTS

WO    WO2006133159    * 12/2006

\* cited by examiner

*Primary Examiner*—Benny Lee
*Assistant Examiner*—Gerald Stevens
(74) *Attorney, Agent, or Firm*—Michael W. Landry; Bruce W. Greenhaus; Steven E. Koffs

(57) ABSTRACT

The present invention reduces distortion in variable capacitance devices by connecting a circuit to the variable capacitance devices that has low impedance at predetermined frequencies to suppress those frequencies and also suppress harmonics and mixing products resulting from mixing of various frequencies.

14 Claims, 9 Drawing Sheets

Resonant at $|f_1 - f_2|$ or $f_1 + f_2$

Series-resonant at $|f_1 - f_2|$ and $f_1 + f_2$

DISTORTION REDUCTION FOR VARIABLE CAPACITANCE DEVICES

RELATED APPLICATIONS

This application claims priority from U.S. provisional application No. 60/812,574 filed Jun. 9, 2006 entitled "Distortion reduction for variable capacitance devices", incorporated herein by reference.

BACKGROUND

1. Field of Invention

The present invention relates to communication systems and more specifically to a variable-capacitance circuit.

2. Prior Art

Variable capacitance devices are often used in frequency-selective circuits such as filters, VCOs, etc. These devices may be implemented using any device whose capacitance depends on an applied DC control voltage. Often diodes (so-called "varactors") are used for this purpose but other devices, for example MOS transistors, may be used, taking advantage of their voltage-dependent CV-curve. In the following, excluding the references, the term "varactor" is to be understood in the broader sense as any kind of variable-capacitance device, not just a diode. Similarly, the varactor symbol shown in FIG. 1 should be construed as any kind of variable-capacitance device. Also, in the following, the "exponent" should be construed as the value of n obtained when the CV-curve is approximated by the following equation:

$$C(V) = \frac{K}{(\phi + V)^n}$$

where V is the applied voltage, C=dQ/dV is the incremental diode capacitance, and $\phi$ and K are constants. The approximation may be global, covering the entire tuning curve, or local, that is, valid for a region around an operating point voltage V0.

The presence of signal voltage across the varactor instantaneously disturbs the DC voltage and therefore modulates the capacitance. This causes distortion. However, it is possible to use two or more varactors in certain configurations wherein this distortion is minimized.

FIG. 2 shows one such structure, as described in the publication by Meyer and Stephens, entitled "Distortion in Variable-Capacitance Diodes" in the Journal of Solid-State circuits, vol. SC-10, No. 1, February 1975, pp. 47-54, incorporated herein by reference. The publication derives expressions for the non-linear coefficients in the C-V curve (equations 39-42 in the paper and repeated below) and it is shown that, as a special case, complete distortion cancellation can be achieved by choosing the varactor to be of equal size (i.e. DA=DB) and the exponent to be n=0.5.

$$C(v) = \frac{1}{P_0} - \frac{2P_1}{P_0^3}v + \frac{3}{P_0^5}(2P_1^2 - P_0 P_2)v^2 + \quad (39)$$

where $$P_0 = \frac{1}{K_0} + \frac{1}{L_0} \quad (40)$$

$$P_1 = \frac{K_1}{2K_0^3} + \frac{L_1}{2L_0^3} \quad (41)$$

$$P_2 = \frac{K_1^2/2 - K_0 K_2/3}{K_0^5} + \frac{L_1^2/2 - L_0 L_2/3}{L_0^5}. \quad (42)$$

In order to achieve sufficiently wide capacitance range, it is often necessary to use varactors with n>0.5 but fortunately the above-mentioned equations show that it is still possible to achieve distortion cancellation. This can be done by choosing DA≠DB. Thus a specific ratio DA/DB can for example give complete cancellation of third-order distortion. The above-mentioned equations are solved for this purpose in the publication by K. Buisman et al., entitled "Distortion-Free Varactor Diode Topologies for RF Adaptivity" in the Microwave Symposium Digest, 2005 IEEE MTT-S International, 12-17 Jun. 2005, pp. 157-160, incorporated herein by reference and the resulting ratio is:

$$\frac{D_A}{D_B} = \frac{4n + 1 + \sqrt{12n^2 - 3}}{2(n+1)}$$

where n is the diode exponent.

Unfortunately, this does not necessarily cancel the second-order distortion and, depending on the surrounding circuitry that the diode pair is used in, the generated second-order distortion currents may develop significant second-order distortion voltages across the diode pair, which in turn modulate the capacitance and causes third-order distortion due to a mixing effect. This is explained in the K. Buisman publication.

FIG. 3 shows a solution to this distortion problem. In order to avoid this problem, the K. Buisman paper proposes a topology in which two diode-pairs are used in an anti-parallel configuration, as shown in FIG. 3. Due to the symmetry achieved, second-order distortion is now also eliminated.

In the K. Buisman publication, the technique is applied to varactors in a specialized silicon-on-glass fabrication process. This allows very high quality-factor varactors to be fabricated with very low loss to the substrate. Unfortunately, more standard high-volume planar fabrication technologies usually have significant substrate losses and consequently the application of the anti-parallel technique may cause unacceptable loss of quality factor (Q) in resonant circuits in which it is used.

FIG. 4 shows a simplified form of a tunable filter in a pi configuration.

FIG. 5 shows the application of the anti-parallel pair configuration of the circuit of FIG. 4.

The resistance Rp of FIG. 4 and FIG. 5 models the equivalent parallel resistance of the inductor due to finite Q and resistances rs and capacitances Cs model substrate loss.

It will now be explained why this structure causes increased substrate loss: If, for example, DA>DB then nodes A and C will have higher signal swing than nodes B and D. This causes increased loss in the substrate resistances depicted as 'rs' in FIG. 5 and that in turn results in degraded Q.

It is therefore desirable to devise a variable capacitance structures that retains the good distortion properties without the penalty of increased substrate loss.

The above discussion shows that it would be desirable to avoid the anti-parallel configuration but still retain the good distortion properties of the single varactor pair. As mentioned, if the exponent n#0.5 then the two varactors would have to be of different size (DA≠DB) and second-order distortion would occur unless the anti-parallel configuration was used to cancel it. In many applications third order distortion is of overriding concern and the second-order distortion itself is of minor importance. The filter of FIG. 4 is an example of this. Here, a desired signal may be present at the resonance frequency f0 but may be contaminated by third-order distortion products generated by interfering signals at frequencies f1 and f2 close to the resonance frequency where f0=(2f1−f2) or f0=(2f2−f1). Since f1 and f2 are close to f0, the filter may not provide much attenuation of these signals, resulting in high amplitudes across the variable capacitances and hence distortion. By contrast, for a second-order product to be generated at f0 at least one of the interfering signals would have to be far from f0 (the conditions would be f0=(f1+f2), f0=|f1−f2|, f0=2f1, or f0=2f2); it would therefore be attenuated greatly by the filter response. Consequently, at least one of the interfering signals will only be present at very low amplitude across the variable capacitance structures and the generated distortion product will be accordingly small. However, the previously mentioned secondary mixing effect that creates additional third-order products from mixing with the fundamental signals can be of great importance. In order to avoid excessive third-order distortion, it can therefore be necessary to eliminate the second-order products.

As mentioned, the most important third-order distortion condition occurs when two interferers are present at frequencies f1 and f2 that are close to the resonance frequency f0. In addition to the unwanted third-order distortion products 2f1−f2 or 2f2−f1, the second-order distortion of the variable capacitance structures will also generate distortion products at |f1−f2|, (f1+f2), 2f1, and 2f2. These products are not of direct concern because they are far away from the desired signal frequency of f0 but they can modulate the variable capacitances such that a mixing effect can occur, which generates secondary distortion products at several frequencies including the following:

$|f1+|f1-f2||=2f1-f2$ for f1>f2

$|f2-|f1-f2||=2f2-f1$ for f1>f2

$|f2+|f1-f2||=2f2-f1$ for f1<f2

$|f1-|f1-f2||=2f1-f2$ for f1<f2

$2f2-f1$ $2f1-f2$

These products fall at the same frequencies as the direct third-order products and are therefore undesirable. Prior art, as described previously, solves this problem by eliminating second-order distortion using either anti-parallel structures or a diode exponent of n=0.5. As mentioned, both solutions have disadvantages.

SUMMARY OF INVENTION

The present invention reduces distortion in variable capacitance devices by connecting a circuit to the devices that has low impedance at predetermined frequencies to suppress those frequencies such as harmonics and other mixing terms between frequencies. This approach removes the second-order products before they can cause the generation of third-order distortion. This can be done by reducing the amplitude of the |f1−f2|, 2f1, and 2f2 products across the variable-capacitance structures. This in turn reduces the amplitude of the generated third-order distortion products at 2f1−f2 and 2f2−f1.

The products at 2f1 and 2f2 can be suppressed by ensuring low impedances at those frequencies, for example, by adding series-resonant circuits between the appropriate nodes in the circuit and ground such that those products are suppressed across the varactor structures.

The suppression circuit added to the variable capacitance devices can have suppression at any frequency or range of frequencies where unwanted product and terms of intermodulating frequencies are present.

Like the 2f1 and 2f2 products, the |f1−f2| product can be suppressed using series-resonant circuits. These can be passive circuits but the |f1−f2| product often occurs at low frequencies, which facilitates the use of active circuits. This is because the worst case for third-order intermodulation distortion is when f1 and f2 are both close to f0 and |f1−f2| is therefore small. Active circuit methods can also be applied to suppress the 2f1 and 2f2 products but these will normally have to operate at high frequency and can therefore be difficult to design.

DETAILED DESCRIPTION OF THE INVENTION

Figure 1:
FIG. 1 shows a prior art variable capacitance device, a varactor.
Figure 2:
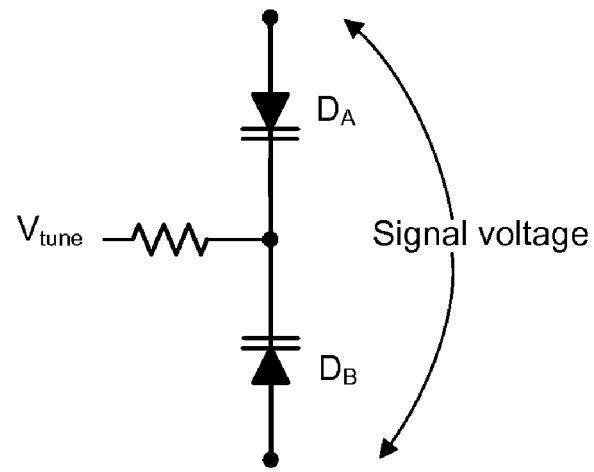
FIG. 2 shows a prior art connection of a tuning voltage to a pair of varactors.
Figure 7:
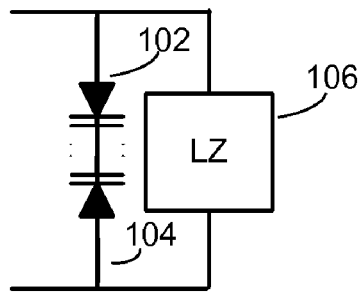
FIG. 7 shows the distortion reduction circuit of the present invention.

FIG. 7 shows an example of a suppression circuit according to the invention, a low impedance circuit block 106, denoted "LZ", applied to variable capacitance devices 102 and 104 connected in a back-to-back configuration. The two terminals of the LZ circuit 106 are connected to the two terminals of the series connected variable capacitance devices 102 and 104. The polarity of the variable capacitance devices can also be reversed. The tuning voltage for varying the capacitance of the varactors can be applied using any topology, including at the middle terminal as shown in FIG. 2, or at the end terminals or differentially across the varactors.

Figure 6:
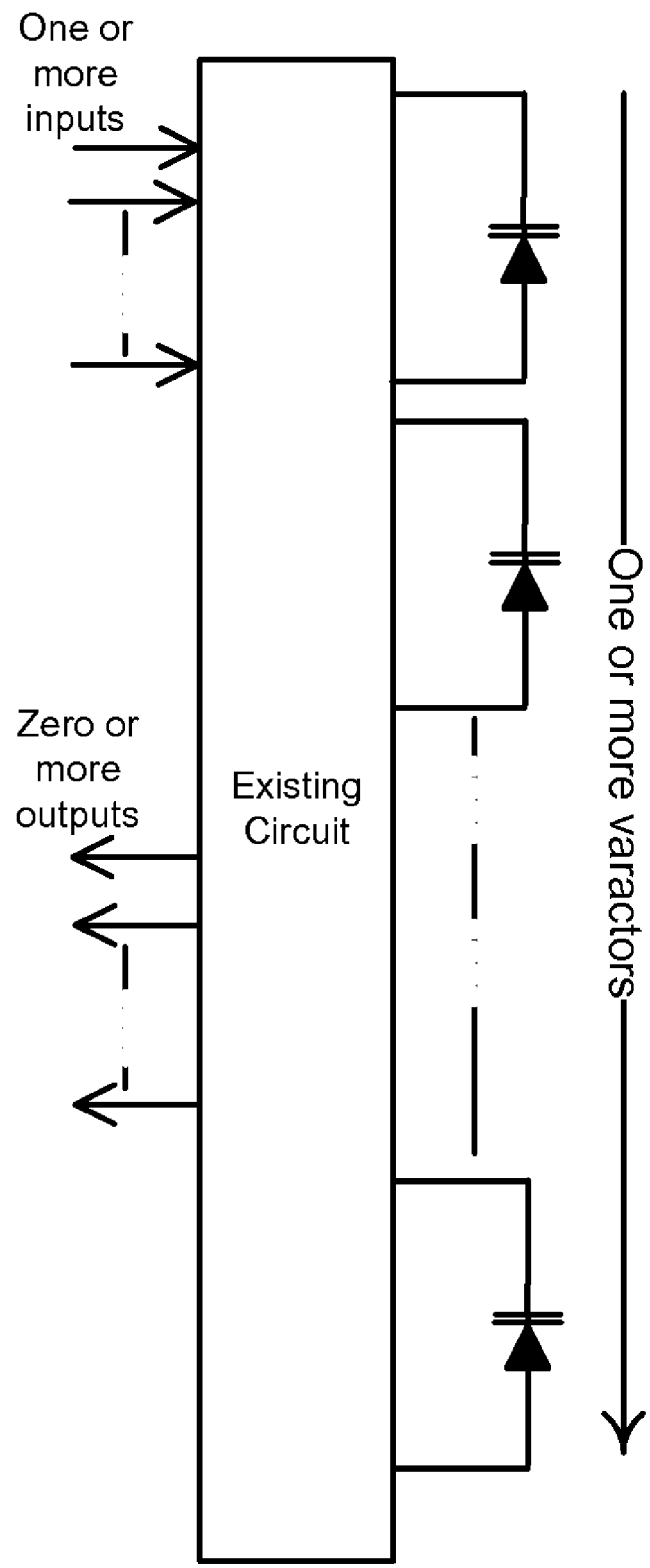
FIG. 6 shows a prior art system with single varactors.
Figure 8:
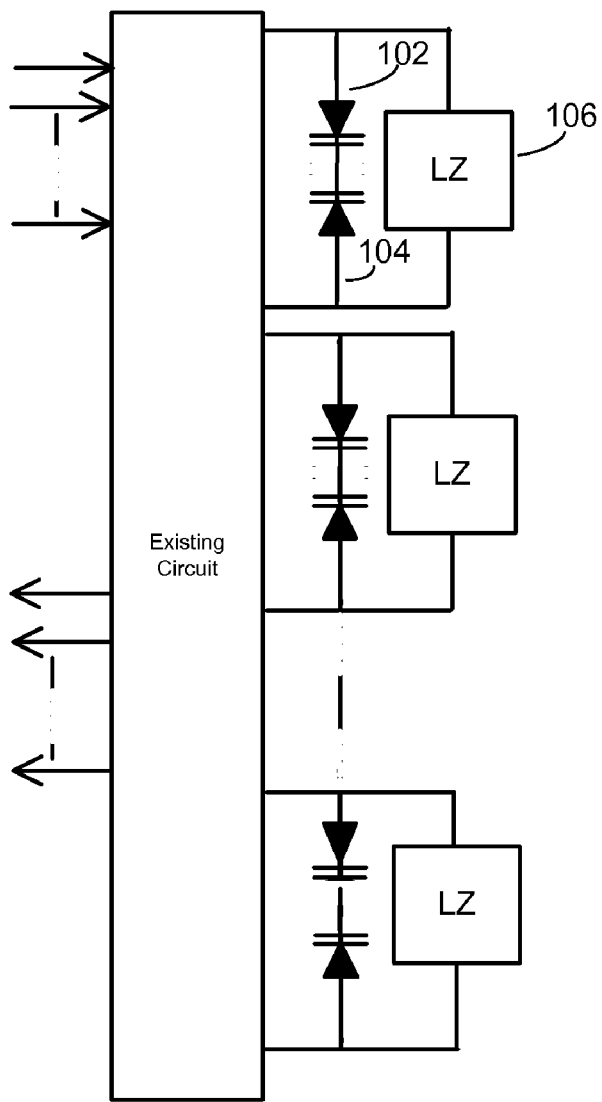
FIG. 8 shows the substitution of the present invention for single varactors.

FIG. 8 shows a block diagram of how the invention can be applied to any circuit that uses variable capacitance devices by a simple substitution: some or all of the varactors in the original circuit in prior art FIG. 6 are replaced with the structures of FIG. 7, using back to back varactors 102 and 104 together with circuit blocks 106, denoted "LZ", that provide low impedances at |f1–f2|, 2f1, 2f2, or a combination of thereof. FIGS. 7 and 8 do not show the tuning voltage connections, which can be added via resistors to the common node between the two cathodes, while ensuring a DC path to ground on the anodes. However, many other well known schemes are possible such as placing a resistor to ground at the common node and applying tuning voltages at the anodes. The invention can be used with any method for applying the tuning voltages.

Figure 3:
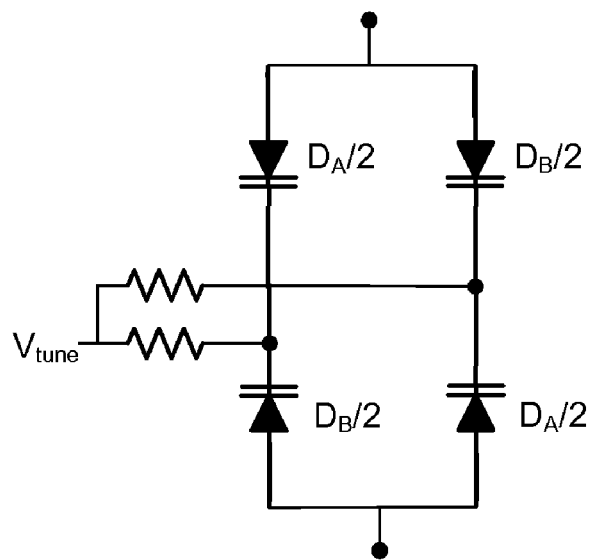
FIG. 3 shows a prior art anti-parallel configuration of varactors.
Figure 4:
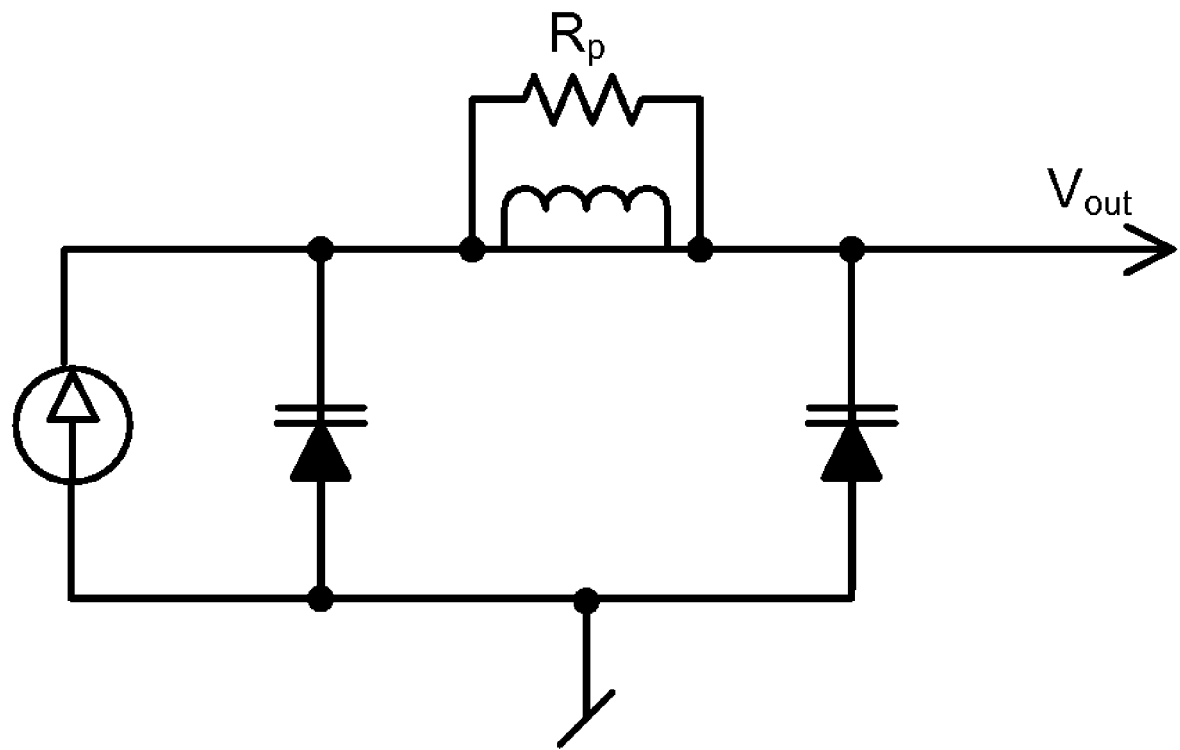
FIGS. 4 and 5 show prior art tunable filters using varactors.
Figure 5:
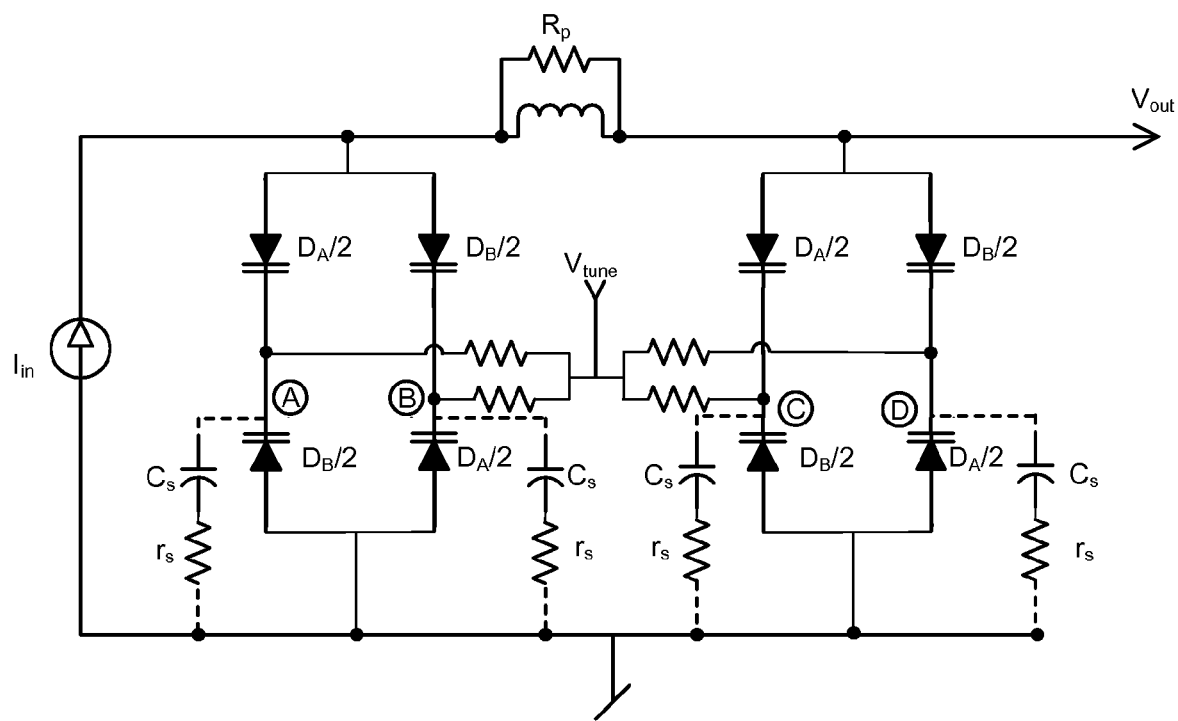
Figure 9:
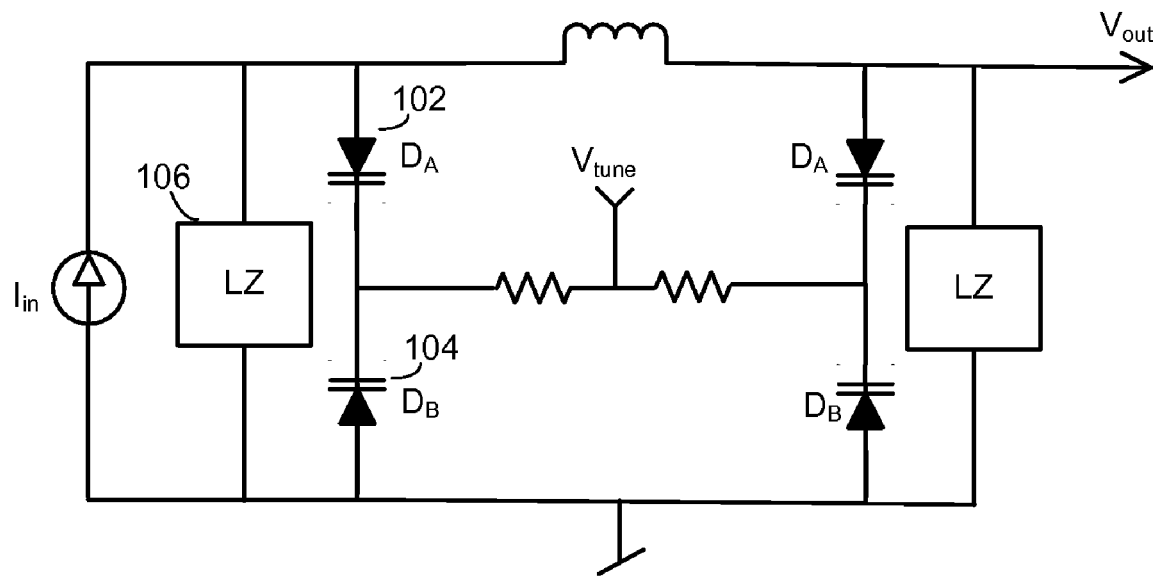
FIG. 9 shows a tunable filter employing the present invention.

FIG. 9 shows how the invention can be applied to the filter example of FIG. 4. The anti-parallel varactor structures of FIG. 3 are no longer necessary and can be replaced with the structure of FIG. 7, which reduces the number of varactor devices needed to implement the tunable filter. When device 104 (DB) is chosen to be greater than device 102 (DA), the signal voltage amplitude across the substrate components is reduced compared to FIG. 5, thus achieving reduced loss and better Q.

Figure 10:
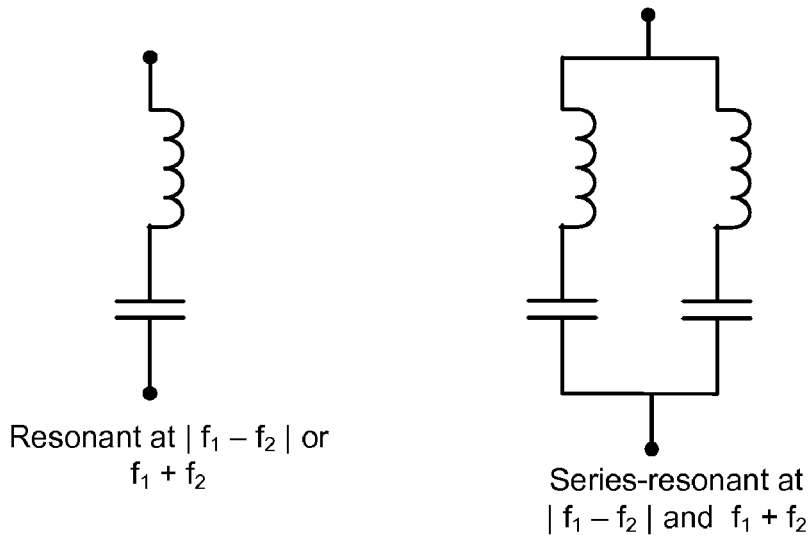
FIG. 10 shows circuits for frequency dependent impedances.
Figure 11:
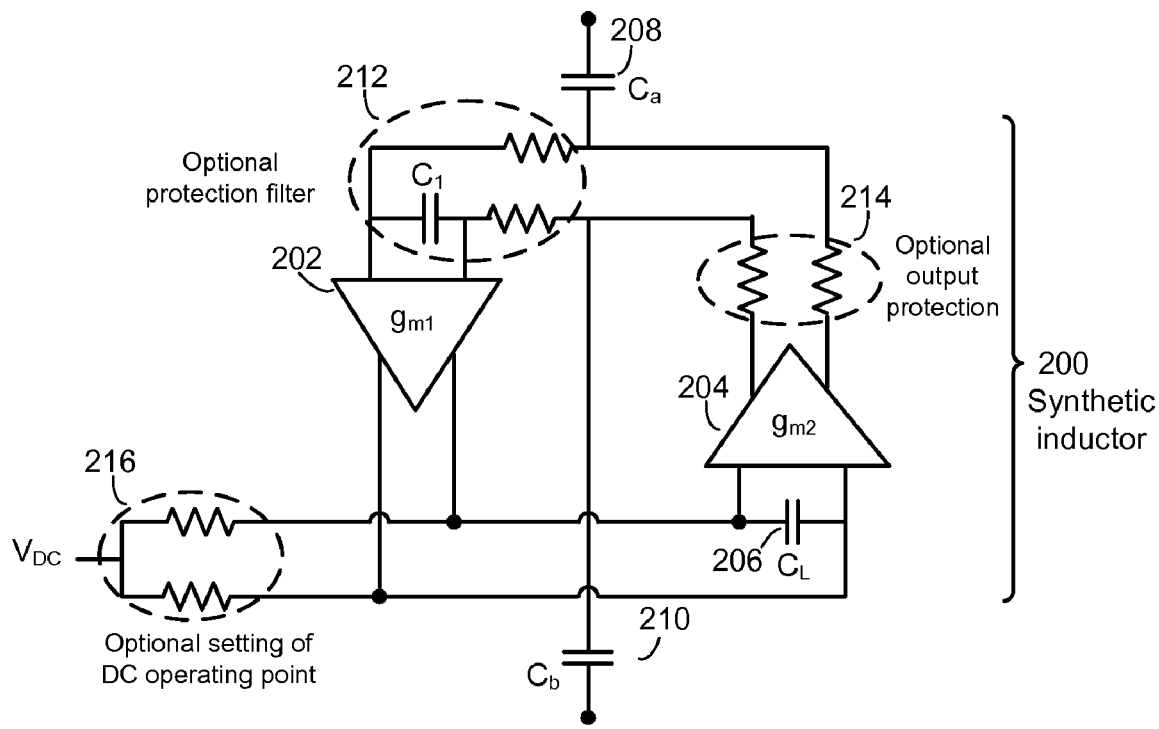
FIG. 11 shows a synthetic inductor.
Figure 12:
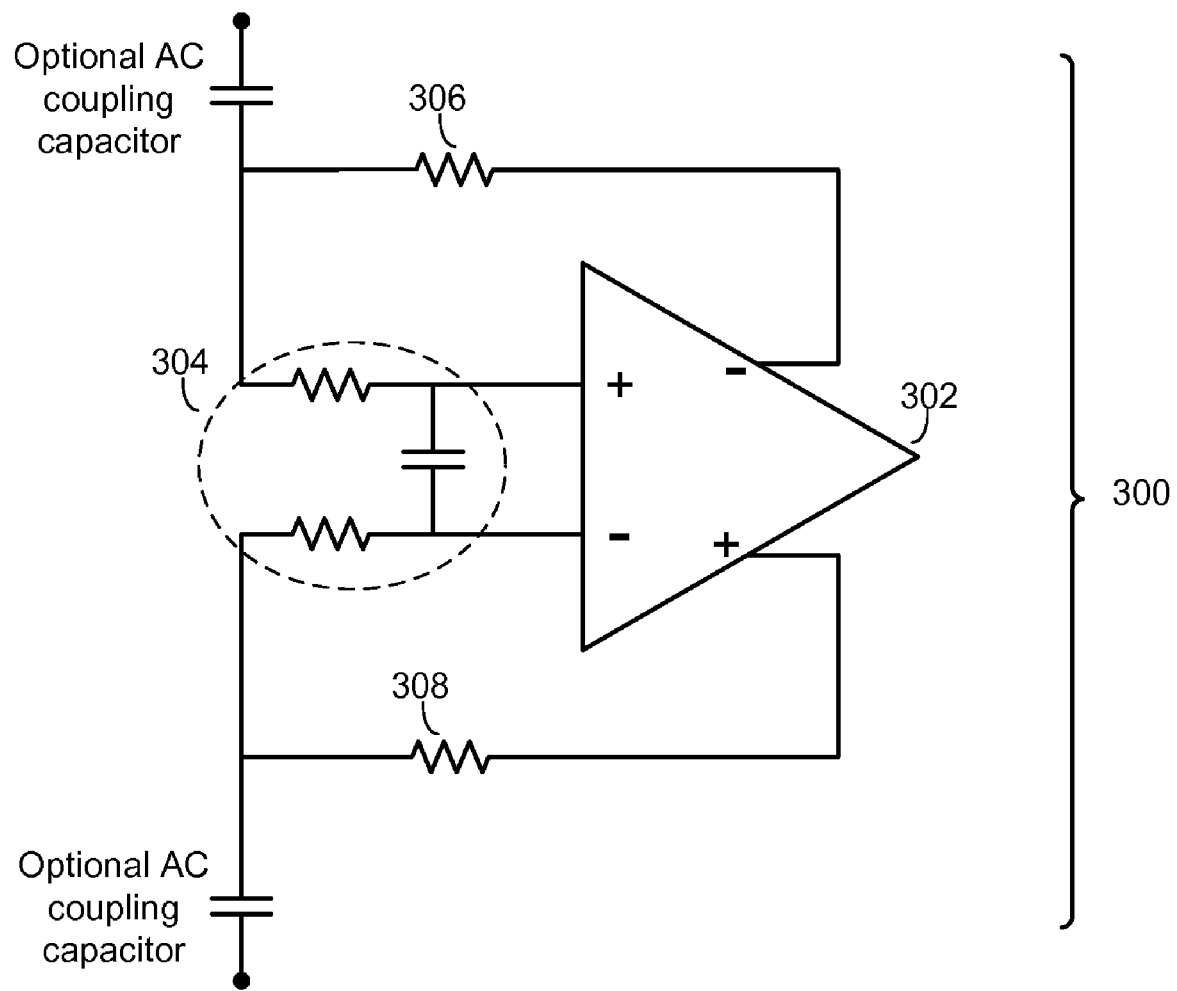
FIG. 12 shows a circuit for implementing a low impedance at low frequencies.
Figure 13:
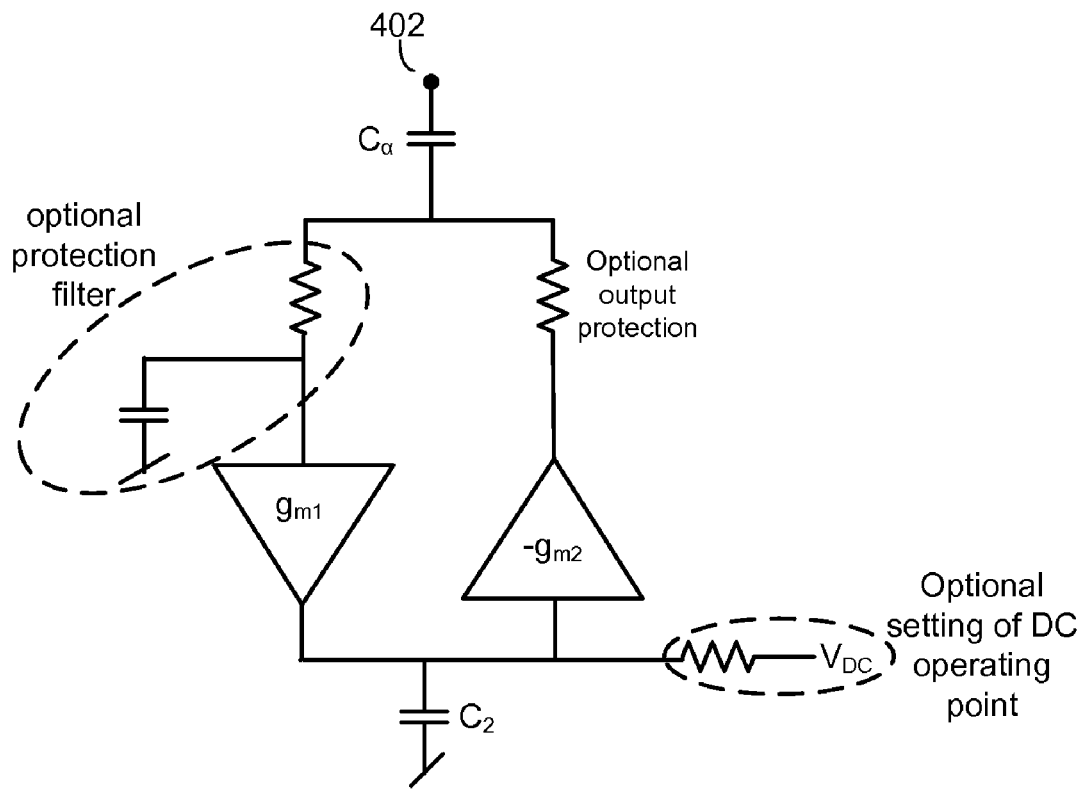
FIGS. 13 and 14 show simplified circuits for creating a low impedance at a single terminal on a varactor.
Figure 14:
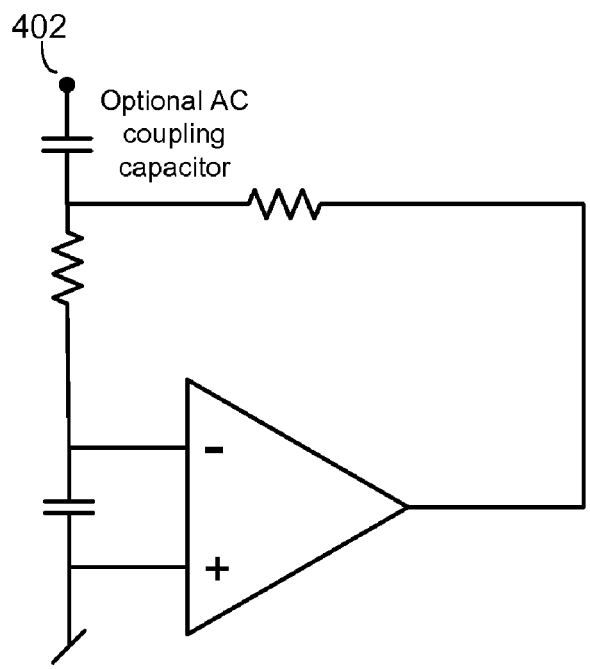

FIG. 10 through FIG. 14 show examples of various implementations of the "LZ" circuits 106. FIG. 10 shows two different passive circuit structures using inductors and capacitors. FIG. 11 and FIG. 12 illustrate active circuit structures in which both terminals can carry signals. FIG. 13 and FIG. 14 show simplified versions of the structures in FIG. 11 and FIG. 12 where one terminal is grounded.

FIG. 11 shows a circuit in which a synthetic inductor 200 is formed by two transconductors 202 and 204 and a capacitor 206 (CL). The synthetic inductor 200 can be used by itself or together with one or two capacitors, 208 and 210 (Ca and Cb). The synthetic inductor has an equivalent inductance of:

$$L_{eff} = \frac{C_L}{g_{m1} g_{m2}}$$

Thus, the impedance of the synthetic inductor is low at low frequency and when it is used by itself it suppresses the |f1–f2| product. At high frequencies, the impedance of the synthetic inductor is high so that it does not load the desired RF signals present across the varactors. Placing capacitor 208 (Ca) and/or 210 (Cb) in series with the synthetic inductor forms a series-resonant circuit that can be tuned to |f1–f2| or f1+f2 (or any other desired frequency).

Depending on the implementation of the transconductors 202 and 204, their inputs or outputs have the potential for generating undesired distortion products due to large amplitude RF signals present. To mitigate this, the protection circuits 212 and 214 can be used for attenuating the RF signals before reaching the transconductors. The capacitances may be provided by the input and output capacitances of the transconductors. Finally, a network 216 is shown that can be used for setting the DC bias level of the synthetic inductor 200. This function is not always necessary as it is often built into the transconductors.

FIG. 12 shows an alternative circuit for implementing low impedance at low frequencies. In this example, input terminals of the amplifier 302, a differential amplifier, receive a low-pass filtered version of the input signals. The amplifier 302 will adjust its outputs in order to minimize the low-frequency signal across its inputs, thus providing low impedance. This figure also shows optional protection devices 304, the R-C-R network at the +/− input, which additionally serves to prevent high frequency signals from reaching the amplifier 302 input that could cause the amplifier 302 to attempt to correct the high frequency signals. The circuit 300 retains a high impedance at RF signals. Additionally, some amplifiers are prone to RF-to-DC conversion at the amplifier inputs, which is eliminated by the input network 304. If the gain-bandwidth product of the amplifier is low and does not suffer from sensitivity to RF at the inputs, the input circuit 304 may not be needed. Additionally, resistors 306 and 308 on the output signals can be used to achieve a high impedance at RF.

FIG. 13 and FIG. 14 show simplified circuits that supply only one active terminal 402. The operation of these circuits is essentially the same as described above for FIG. 11 and FIG. 12. For any given circuit described by FIG. 7, some of the "LZ" circuits 106 may have one terminal connected to signal ground. In these cases, the simplified circuits of FIG. 13 and FIG. 14 can advantageously be employed. Even for "LZ" circuits where none of the terminals are signal ground, it may be advantageous to employ the methods of FIG. 13 and FIG. 14. In this case, each terminal of the "LZ" circuit can be connected to a separate circuit of the type shown in FIG. 13 or FIG. 14.

What is claimed is:

1. A tunable filter comprising:
a first tunable capacitor circuit comprising:
a first variable capacitance device and a second variable capacitance device connected in series, the first and second variable capacitance devices being of unequal sizes; and
a low impedance circuit connected in parallel with the series connected variable capacitance devices, the low impedance circuit configured to reduce a third order distortion in signals output by the first and second variable capacitance devices; and
an inductor connected to the first tunable capacitor circuit to form a resonant circuit.

2. The tunable filter of claim 1 wherein the frequencies suppressed are second order products of frequencies near the resonance frequency of the filter.

3. The tunable filter of claim 1 further comprising a second tunable capacitor circuit connected to the inductor to form a pi configuration.

4. A circuit comprising:
a first variable capacitance device and a second variable capacitance device connected in series, the first and second variable capacitance devices being of unequal sizes; and
a low impedance circuit, for suppressing predetermined frequencies to reduce a third order distortion in signals output by the first and second variable capacitance devices, the low impedance circuit having two terminals connected in parallel with the series connected variable capacitance devices.

5. The circuit of claim 4 wherein the variable capacitance devices are varactors.

6. The circuit of claim 4 wherein the low impedance circuit is a passive circuit using at least one inductor and at least one capacitor.

7. The circuit of claim 4 wherein the variable capacitance devices are used in a resonant circuit and the frequencies suppressed are second order products of frequencies near the resonance frequency of the resonant circuit.

8. The circuit of claim 4 wherein the low impedance circuit comprises:
a synthetic inductor comprising:
a first transconductor and a second transconductor wherein the outputs of the first transconductor are coupled to the inputs of the second transconductor, and the outputs of the second transconductor are coupled to the inputs of the first transconductor and the outputs of the second transconductor form the terminals of the low impedance circuit; and a capacitor connected across the inputs of the second transconductor.

9. The circuit of claim 4 wherein the low impedance circuit comprises an amplifier with the amplifier inputs connected to the low impedance circuit terminals, and resistors connected between the amplifier outputs and the low impedance circuit terminals.

10. The circuit of claim 4, wherein the variable capacitance devices are varactors and the diode exponent is greater than or less than 0.5.

11. The circuit of claim 4, wherein the circuit is a filter circuit.

12. A method comprising:

connecting a pair of variable capacitance devices in series, the first and second variable capacitance devices being of unequal sizes; and connecting a low impedance circuit in parallel with the series connected variable capacitance devices, the low impedance circuit configured to suppress third order distortion of signals output by the variable capacitance devices.

13. The method of claim 12 wherein the low impedance circuit is a frequency selective circuit that provides low impedance across a range of frequencies and high impedance at other frequencies.

14. The method of claim 12, wherein the variable capacitance devices have a diode exponent greater than or less than 0.5.

* * * * *